(12) United States Patent
Zhang et al.

(10) Patent No.: US 11,532,265 B2
(45) Date of Patent: Dec. 20, 2022

(54) DRIVING BACKPLANE AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Zhi Zhang, Beijing (CN); Xuemei Zhao, Beijing (CN); Qingpu Wang, Beijing (CN); Zhen Qiu, Beijing (CN); Tengfei Zhong, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/512,507

(22) Filed: Oct. 27, 2021

(65) Prior Publication Data
US 2022/0319396 A1    Oct. 6, 2022

(30) Foreign Application Priority Data

Mar. 31, 2021  (CN) .......................... 202110351467.0

(51) Int. Cl.
*G09G 3/32*    (2016.01)
*G09F 9/33*    (2006.01)

(52) U.S. Cl.
CPC .................. *G09G 3/32* (2013.01); *G09F 9/33* (2013.01)

(58) Field of Classification Search
CPC ..................................... G09G 3/32; G09F 9/33
See application file for complete search history.

(56) References Cited

U.S. PATENT DOCUMENTS

| | | | |
|---|---|---|---|
| 2012/0074421 A1* | 3/2012 | Kanegae | H01L 27/3248 438/34 |
| 2012/0105939 A1* | 5/2012 | van Aerle | G02F 1/167 359/290 |
| 2016/0316539 A1* | 10/2016 | Afzali-Ardakani | H01L 27/1214 |
| 2019/0261512 A1 | 8/2019 | Huang et al. | |
| 2020/0105793 A1 | 4/2020 | Ding et al. | |
| 2021/0240025 A1* | 8/2021 | Tanaka | H01L 29/7869 |

FOREIGN PATENT DOCUMENTS

| | | |
|---|---|---|
| CN | 109360828 A | 2/2019 |
| CN | 109545934 A | 3/2019 |
| CN | 211044904 U | 7/2020 |
| CN | 111508976 A | 8/2020 |
| CN | 111696738 A | 9/2020 |

OTHER PUBLICATIONS

CN202110351467.0 first office action.

* cited by examiner

*Primary Examiner* — Muhammad N Edun
(74) *Attorney, Agent, or Firm* — IPro, PLLC

(57) ABSTRACT

Disclosed are a driving backplane and a display apparatus, including: a base substrate, a first conducting layer disposed on one side of the base substrate, a second conducting layer disposed on one side, facing away from the base substrate, of the first conducting layer, and a first insulating layer disposed between the first conducting layer and the second conducting layer, where the second conducting layer includes a plurality of pads, and each pad is connected with the first conducting layer through at least two first via holes.

17 Claims, 4 Drawing Sheets

DRIVING BACKPLANE AND DISPLAY APPARATUS

The present disclosure claims the priority from Chinese Patent Application No. 202110351467.0, filed with the Chinese Patent Office on Mar. 31, 2021, and entitled "DRIVING BACKPLANE AND DISPLAY APPARATUS", which is hereby incorporated by reference in its entirety.

FIELD

The present disclosure relates to the technical field of display, in particular to a driving backplane and a display apparatus.

BACKGROUND

A Mini light-emitting diode (Mini-LED) is a new-type LED display technology derived on the basis of a small-spacing LED. The Mini-LED falls in between a traditional LED and a Micro LED. The Mini-LED has an obvious trend of being using in a high-end display field due to its good display effect, a light-thin experience, and meanwhile, the advantages of good contrast, long life and the like.

SUMMARY

The present disclosure discloses a driving backplane and a manufacturing method.

In a first aspect, the present disclosure provides a driving backplane, including: a base substrate; a first conducting layer disposed on one side of the base substrate; a second conducting layer disposed on one side, facing away from the base substrate, of the first conducting layer; and a first insulating layer disposed between the first conducting layer and the second conducting layer;

where the second conducting layer includes a plurality of pads, and each pad is connected with the first conducting layer through at least two first via holes.

In the driving backplane provided by the present application, the second conducting layer has the plurality of pads; the at least two first via holes are formed in a region, corresponding to each pad, of the first insulating layer; and each pad is electrically connected with the first conducting layer through the at least two first via holes, so that an adhesive force between the second conducting layer and the first insulating layer is improved, and the pads of the second conducting layer are not prone to falling off from the first insulating layer. In addition, each pad and the first conducting layer are conducted through the plurality of first via holes, in this way, even if the first via holes corresponding to a partial region in the pad are damaged, the pad may still keep good conducting with the first conducting layer through the other first via holes, thereby increasing a yield for connection of the pads in the second conducting layer and the first conducting layer.

Optionally, pore diameters of the at least two first via holes are 2 μm-40 μm.

Optionally, each pad corresponds to the at least two first via holes; and in a plurality of first via holes corresponding to the same pad, the pore diameters of at least two of the plurality of first via holes corresponding to the same pad are different.

Optionally, the first insulating layer between the first conducting layer and the second conducting layer includes a plurality of sublayers, part of the sublayers are organic sublayers, and part of the sublayers are inorganic sublayers.

Optionally, a surface, facing away from the base substrate, of each pad has a concave-convex structure.

Optionally, the first conducting layer has a plurality of opening regions and a plurality of conducting islands, where each opening region is internally provided with the at least one conducting island, and a gap is formed between a periphery of each conducting island and an edge of a corresponding opening region; and each pad is electrically connected with the at least one conducting island.

Optionally, the gap between the periphery of each conducting island and the edge of the corresponding opening region is greater than or equal to a preset value, and the preset value includes a sum of a process tolerance, an impurity maximum size and a reserved spacing.

Optionally, the pad is connected with the plurality of conducting islands through the at least two first via holes, where the plurality of conducting islands corresponding to the pad are mutually independent, or at least one part of the plurality of conducting islands corresponding to the pad are mutually connected.

Optionally, a material of the conducting islands and a material of the first conducting layer are the same.

Optionally, the materials of both the conducting islands and the first conducting layer are copper.

Optionally, the driving backplane further includes: a second insulating layer disposed on one side, facing away from the base substrate, of the second conducting layer; and the second insulating layer has second via holes, and the second via holes expose the pads.

Optionally, in each pad and the second via hole corresponding to the each pad, an orthographic projection of the concave-convex structure on the surface, facing away from the base substrate, of the each pad on the base substrate is located in an orthographic projection of the second via hole on the base substrate.

In a second aspect, the present disclosure provides a display apparatus, including any one driving backplane in the first aspect.

DETAILED DESCRIPTION OF THE EMBODIMENTS

The technical solutions in the embodiments of the present disclosure will be described clearly and completely with reference to the drawings in the embodiments of the present disclosure. Obviously, the described embodiments are only part of the embodiments of the present disclosure, but not all the embodiments. On the basis of the embodiments in the present disclosure, all other embodiments obtained by those skilled in the art without inventive efforts fall within the protection scope of the present disclosure.

When a driving backplane of some electronic equipment is manufactured, a first conducting layer and a second conducting layer need to be disposed on the base substrate in a stacked mode, and an insulating layer is disposed between the first conducting layer and the second conducting layer so as to isolate the first conducting layer from the second conducting layer. Taking a driving backplane of a Mini-LED as an example, a pad region is formed on a second conducting layer of the driving backplane, and the pad region at least has the following defects: an adhesive force between the pad and an insulating layer is poor; a via hole formed in the insulating layer and configured to connect the pad and a first conducting layer will be destroyed when the pad is damaged or repaired, resulting in poor conductivity between the first conducting layer and the pad of the second conducting layer; and when the second conducting layer is subjected to a surface-mount technology (SMT), a protecting layer is heated to be expanded and shrunk, resulting in poor conductivity between the first conducting layer and the second conducting layer caused by damage of the second conducting layer. The above SMT is an electronic assembly technology. According to the technology, electronic components such as a resistor, a capacitor, a transistor and an integrated circuit are mounted on a printed circuit board, electrical connection is formed through brazing, and therefore, corresponding through holes do not need to be reserved for pins of the components. The used components are also called surface-mount devices (SMD) for short.

Figure 1A:
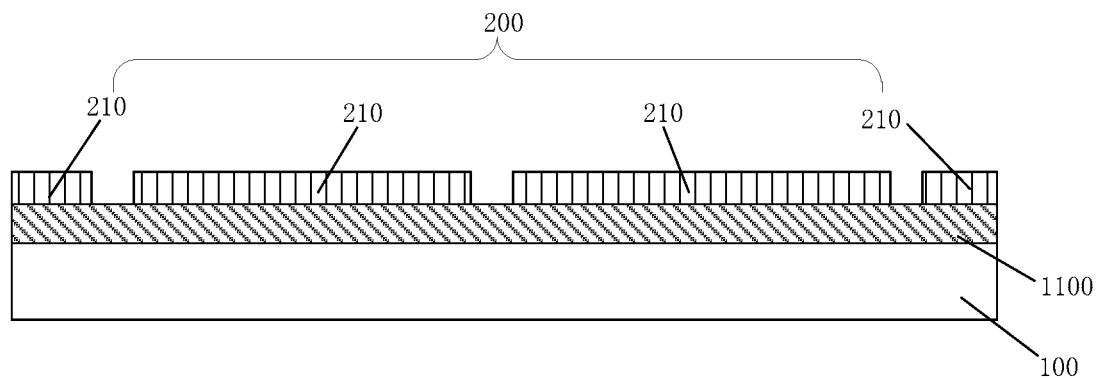
FIGS. 1A-1D are manufacturing flow charts of a driving backplane provided by an embodiment of the present disclosure.
Figure 1B:
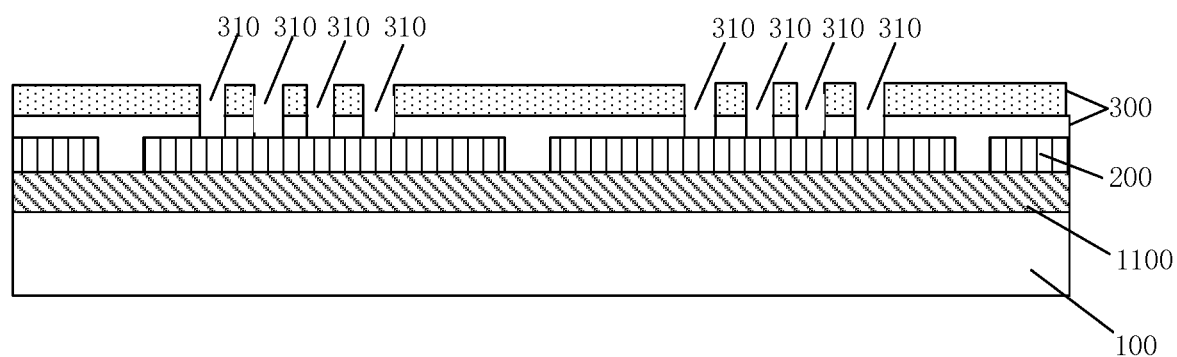
Figure 1C:
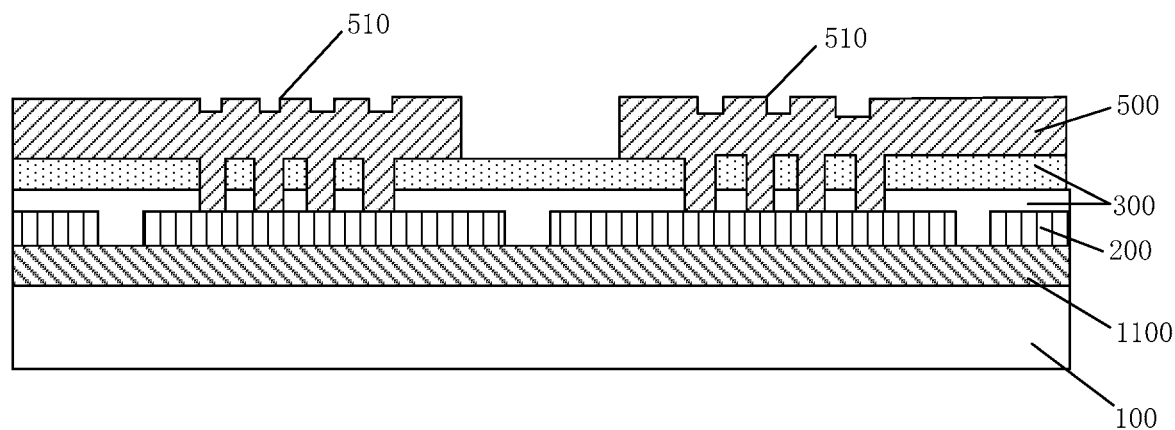

In an embodiment provided by the present disclosure, as shown in FIGS. 1A, 1B and 1C, the driving backplane includes a base substrate 100, a first conducting layer 200 and a second conducting layer 500. The first conducting layer 200 is disposed on one side of the base substrate 100; the second conducting layer 500 is disposed on one side, facing away from the base substrate 100, of the first conducting layer 200; and a first insulating layer 300 is disposed between the first conducting layer 200 and the second conducting layer 500.

The first conducting layer 200 is usually configured to arrange various signal lines, for example, a public voltage line GND, a driving voltage line VLED, a source power line PWR, a source address line DI and the like. Optionally, a thickness of the first conducting layer 200 is about 1.5-7 μm, a material of the first conducting layer includes copper or other conductive metals, for example, a laminated material such as MoNb/Cu/MoNb may be formed in a sputtering mode, a bottom layer MoNb (300 Å) is used for improving an adhesive force, an intermediate layer Cu is used for transmitting electric signals, and a top layer MoNb (200 Å) is used for preventing oxidation. This film layer may further be formed in an electroplating mode, a seed layer MoNiTi is formed firstly to improve grain nucleation density, and then an anti-oxidation layer MoNiTi is manufactured after electroplating.

The second conducting layer 500 includes a plurality of pads 520, and the plurality of pads 520 have the different functions, for example, the pads 520 may be used for mounting functional components, for example, a light emitting device, a sensor, etc., and may further be used for mounting a driving chip. Optionally, a thickness of the second conducting layer 500 is about 6000 Å, a material of the second conducting layer may be a laminated material such as MoNb/Cu/CuNi, a bottom layer MoNb is used for improving an adhesive force, an intermediate layer Cu is used for transmitting electric signals, and a top layer CuNi may achieve oxidation preventing and die-bond fastness.

Aiming at solving the problem of low adhesive force between the second conducting layer 500 and the first insulating layer 300, as shown in FIGS. 1A and 1B, in a first aspect, an embodiment of the present disclosure provides a driving backplane, including: a base substrate 100, a first conducting layer 200 disposed on one side of the base substrate 100, a second conducting layer 500 disposed on one side, facing away from the base substrate 100, of the first conducting layer 200, and a first insulating layer 300 disposed between the first conducting layer 200 and the second conducting layer 500; where the second conducting layer 500 includes a plurality of pads 520, and each pad 520 is connected with the first conducting layer 200 through at least two first via holes 310.

It should be noted that in the driving backplane provided by the above embodiment, in the plurality of pads 520 disposed on the second conducting layer 500, the at least two first via holes 310 are formed in a region, corresponding to each pad 520, of the first insulating layer 300; and each pad 520 is electrically connected with the first conducting layer 200 through the at least two first via holes 310; so that an adhesive force between the second conducting layer 500 and the first insulating layer 300 is improved, and the pads 520 of the second conducting layer 500 are not prone to falling off from the first insulating layer 300.

Meanwhile, each pad 520 and the first conducting layer 200 are conducted through the at least two first via holes 310, in this way, even if the first via hole 310 corresponding to a partial region in the pad 520 is damaged, the pad 520 may still keep good conducting with the first conducting layer 200 through the other first via holes 310, thereby increasing a yield for connection of the pads 520 in the second conducting layer 500 and the first conducting layer 200.

In one specific implementation, in the driving backplane provided by the above technical solution, the at least two first via holes 310 are formed in a position, corresponding to each pad 520, of the first insulating layer 300. The at least two first via holes 310 may have various arrangement modes, for example, there may be a plurality of the above first via holes 310, which may be combined and arranged into a multi-row and multi-column array mode, or arranged into a multi-row and multi-column mode in which the every two adjacent rows of the via holes are mutually staggered. Through the multi-row and multi-column arrangement mode, the quantity of the first via holes 310 covered in each unit region of the pads 520 can be further increased, the adhesive force between the pads 520 and the first insulating layer 300 is further improved, and meanwhile, the yield for electrical connection between the pads 520 and the first conducting layer 200 is increased. Certainly, the plurality of first via holes 310 corresponding to each pad 520 may further has a single-row arrangement mode.

In one specific implementation, each pad 520 is connected with the first conducting layer 200 through the at least two first via holes 310, and pore diameters of the first via holes 310 are 2 μm-40 μm.

In the solution provided by the embodiment of the present disclosure, when a mask plate process is used to form the plurality of first via holes 310 in the first insulating layer 300, a pattern on a mask plate may be changed according to the pore diameters of the first via holes 310 relative to a pattern of a corresponding region of a mask plate adopted in the related art, and a new patterning process is not needed to be increased, thereby effectively saving a process. For example, a pattern of a large hole corresponding to the mask plate used in the related art may be modified into a pattern of a plurality of small holes.

In addition, in consideration that a process precision is limited and an error may exist during actual manufacturing, the pore diameters of the first via holes 310 should not be too small. If the pore diameters of the first via holes 310 are too small, when the pads 520 are connected with the first conducting layer 200 through the first via holes 310, the problem of poor adhesive force between the pads 520 and the first conducting layer 200 will occur. Therefore, the pore diameters of the first via holes 310 may specifically be 2 μm, 5 μm, 10 μm, 15 μm, 20 μm, 30 μm or 40 μm.

The pore diameters of the plurality of first via holes 310 corresponding to each pad 520 may be the same or different.

Specifically, in the plurality of first via holes 310 corresponding to each pad 520, the pore diameters of the at least two first via holes 310 are different, and specific disposing modes may be the following.

Mode 1, the pore diameter of each first via hole 310 is different from the pore diameters of other first via holes 310; for example, one pad 520 corresponds to three first via holes 310, and the pore diameter of each of the three first via holes 310 is different from the pore diameters of other two first via holes 310.

Mode 2, in the plurality of first via holes 310, the pore diameters of part of the first via holes 310 are the same, the pore diameters of the other part of the first via holes 310 are the same, and the pore diameters of the two parts of the first via holes 310 are different.

The two kinds of disposing modes mentioned in mode 1 and mode 2 enable the adhesive force between the second conducting layer 500 and the first insulating layer 300 at different positions to be different. When the first via holes 310 are disposed in each pad 520 through the above mode 1 and mode 2, even if the partial position between the pads 520 of the second conducting layer 500 and the first insulting layer 300 falls off, connection between conducting islands 210 of the first conducting layer 200 and the pads 520 of the second conducting layer 500 can still be ensured.

Optionally, the pore diameters of the at least two first via holes 310 corresponding to each pad 520 are the same. Specifically, in the plurality of first via holes 310 corresponding to each pad 520, the pore diameters of all the first via holes 310 are the same. The pore diameters of the plurality of first via holes 310 corresponding to each pad are disposed to be the same, so that the adhesive force between the pads 520 and the first insulating layer 300 is improved, and meanwhile the manufacturing process is relatively simple.

In one specific implementation, the first insulating layer 300 between the first conducting layer 200 and the second conducting layer 500 may include a plurality of sublayers; and in the plurality of sublayers, part of the sublayers are organic sublayers, and the other part of the sublayers are inorganic sublayers. For example, for the first insulating layer 300, the inorganic sublayers and the organic sublayers may be specifically disposed alternately. Specifically, in order to increase an adhesive force between the first conducting layer 200 and the first insulating layer 300 and the adhesive force between the second conducting layer 500 and the first insulating layer 300, the inorganic sublayers are respectively attached to the first conducting layer 200 and the second conducting layer 500, and at least one organic sublayer is disposed between the inorganic sublayers respectively attached to the first conducting layer 200 and the second conducting layer 500. Specifically, the above inorganic sublayers can increase adsorbability with the first conducting layer 200 and the second conducting layer 500, and also have good water oxidation preventing performance, thereby further preventing oxidation of the first conducting layer 200 and the second conducting layer 500.

In one specific implementation, as shown in FIG. 1C, as an example, a concave-convex structure 510 is formed on a surface of one side, facing away from the base substrate 100, of each pad 520. Specifically, because the surface, facing away from the base substrate 100, of each pad 520 has the concave-convex structure 510, a binding force between a solder and the pads 520 can also be enhanced during a subsequent SMT.

Figure 1D:
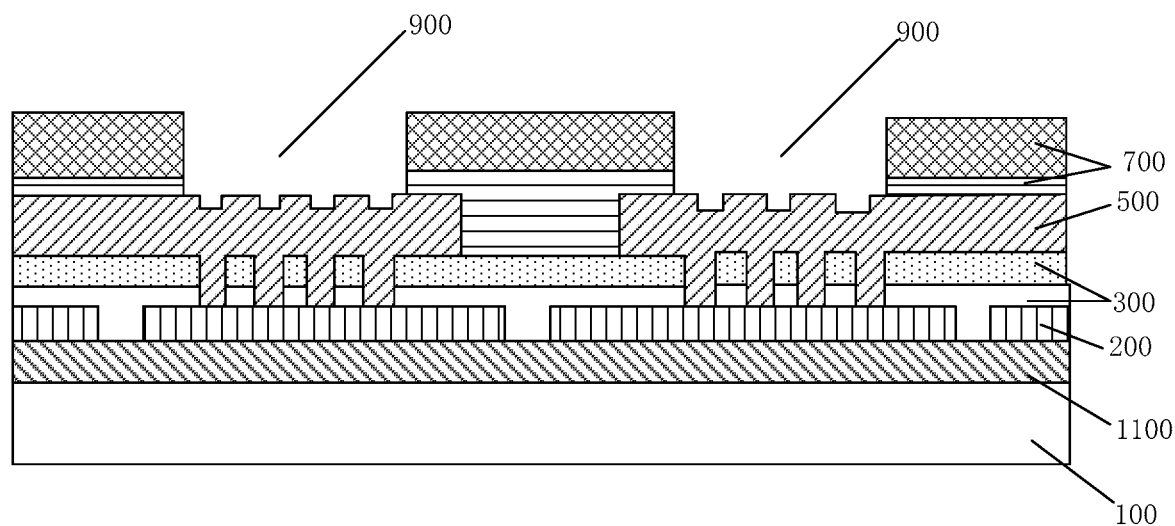

In one specific implementation, as shown in FIG. 1D, as an example, the driving backplane further includes: a second insulating layer 700 disposed on one side, facing away from the base substrate 100, of the second conducting layer 500; where the second insulating layer 700 is provided with second via holes 900, and the pads 520 are exposed from the second via holes 900.

Specifically, in each pair of mutually-corresponding second via hole 900 and the pad 520, an orthographic projection of the concave-convex structure 510 disposed on the pad 520 on the base substrate 100 is located in an orthographic projection of the second via hole 900 on the base substrate 100.

In addition, in the driving backplane in the related art, the first insulating layer 300 is disposed between the second conducting layer 500 and the first conducting layer 200. Due to limitation of a size of a substrate, process and the like, when manufactured, the second conducting layer 500 located on an upper layer is always inevitably overlapped with the first conducting layer 200 below; and the overlapped region of the second conducting layer 500 and the first conducting layer 200 is a region weak in performance, and is prone to being in short circuit or open circuit, resulting in occurrence of badness or influence of reliability.

A reason of the short circuit between the second conducting layer 500 and the first conducting layer 200 lies in that the first conducting layer 200 is usually disposed to be thick and wide so as to provide larger voltage/current and lower resistance, and the second conducting layer 500 is usually disposed to be narrower and shorter, so that a certain potential difference exists between the first conducting layer and the second conducting layer. Because in the manufacturing process of a glass-based film, the first insulating layer 300 between the second conducting layer 500 and the first conducting layer 200 is in a semi-solid and semi-liquid state before curing, water vapor introduced in the process is possibly left in the first insulating layer 300. The corrosion essence of the Cu in the first conducting layer 200 is electrochemical corrosion, water is prone to causing an electrochemical reaction under existence of the potential difference to form $OH^-$— in the first insulating layer 300, and $OH^-$— will cause the short circuit between the first conducting layer 200 and the second conducting layer 500.

The first conducting layer 200 and the second conducting layer 500 involved in the embodiments of the present disclosure are copper or any other conductive materials, and the second conducting layer 500 and the first conducting layer 200 are in short circuit due to foreign matter or electrochemical growth. Therefore, in order to solve the problem of the short circuit between the second conducting layer 500 and the first conducting layer 200, the following improvement is performed.

Figure 2:
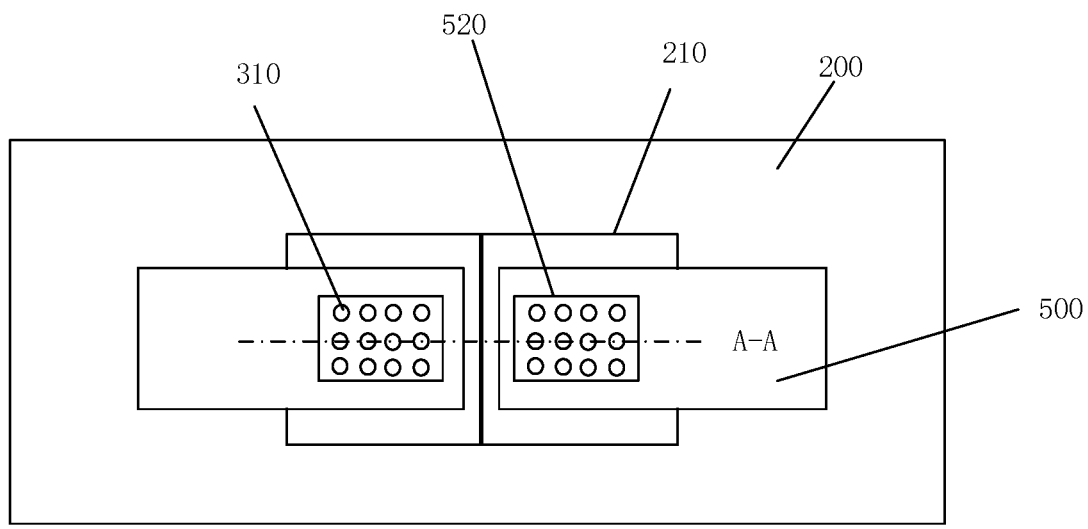
FIG. 2 is a top view of a driving backplane provided by an embodiment of the present disclosure.
Figure 3:
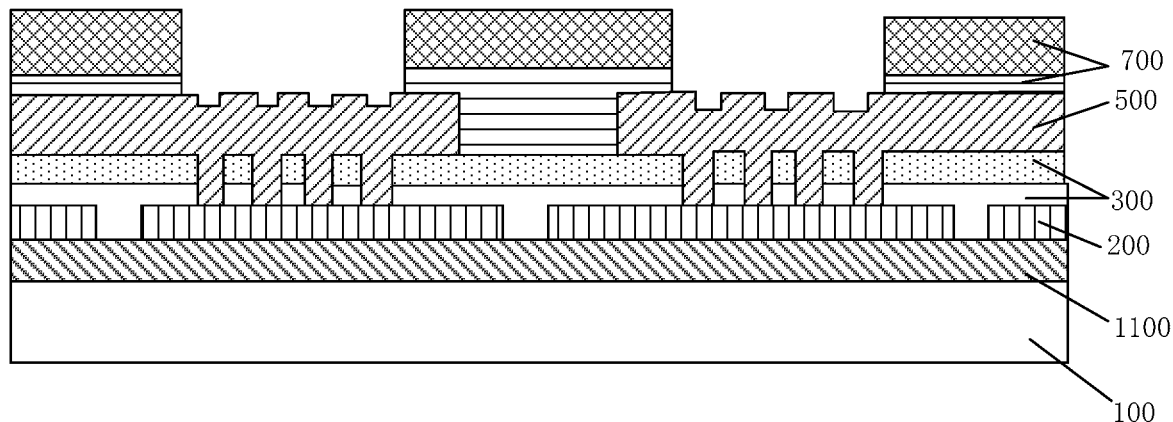
FIG. 3 is a schematic diagram of a sectional structure along the line A-A in FIG. 2.

In one specific implementation, as shown in FIG. 2 and FIG. 3, the first conducting layer 200 has a plurality of opening regions and the plurality of conducting islands 210, each opening region is internally provided with the at least one conducting island 210, and a gap is formed between a periphery of each conducting island 210 and an edge of the corresponding opening region; and each pad 520 is electrically connected with the at least one conducting island 210.

The first conducting layer 200 has the plurality of opening regions and the plurality of conducting islands 210. Optionally, each opening region may be internally provided with one conducting island 210, or each opening region is internally provided with the plurality of conducting islands 210, and the gap is formed between the periphery of each conducting island 210 and the edge of the corresponding opening region, so that a certain distance is reserved between the periphery of each conducting island 210 and the edge of the corresponding opening region, thereby further reducing the possibility of a short circuit between the second conducting layer 500 and the first conducting layer 200.

Figure 5:
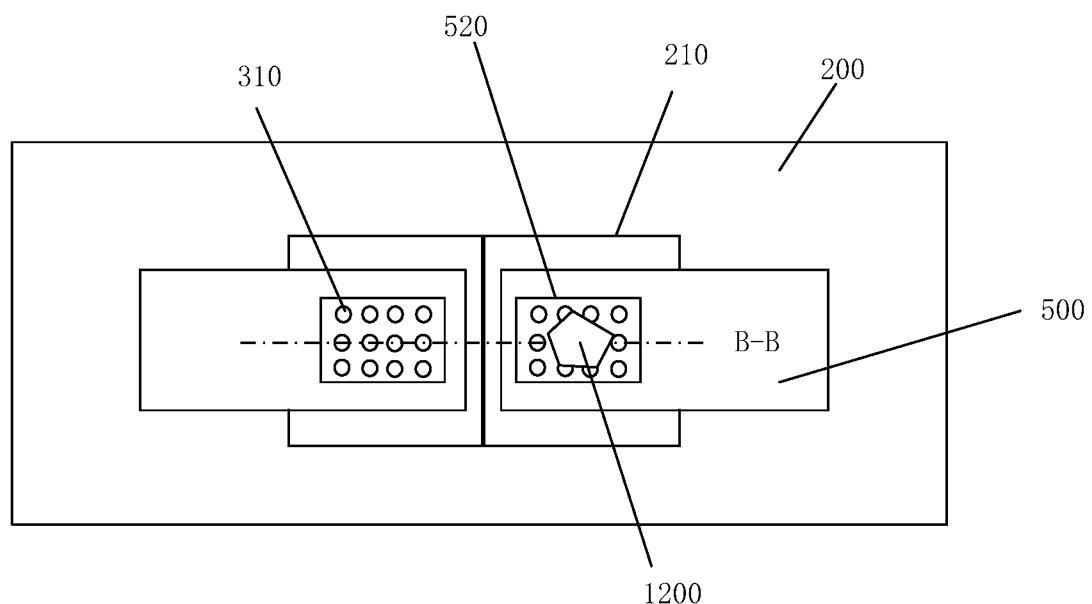
FIG. 5 is a top view of a structure where a pad region has a partial peeling problem after rework of a driving backplane provided by an embodiment of the present disclosure.
Figure 6:
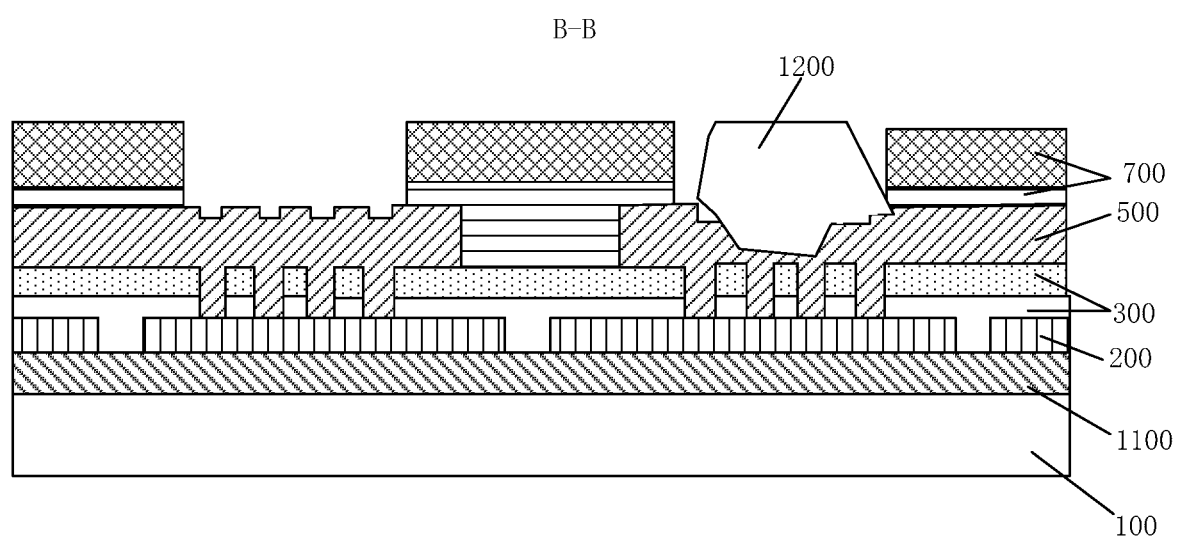
FIG. 6 is a schematic diagram of a sectional structure along the line B-B in FIG. 5.

As shown in FIG. 5 and FIG. 6, specifically, because the second conducting layer 500 and the isolated conducting islands 210 of the first conducting layer 200 are conducted through the plurality of first via holes 310, during rework, that is, when a component 1000 is connected with the pads 520 of the second conducting layer 500 again through a solder layer, the partial region of the pads 520 of the second conducting layer 500 is peeled or damaged, and the other regions of the pads 520 of the second conducting layer 500 may still keep good conducting with the conducting islands 210 in the first conducting layer 200. Specifically, a forming mode of the above conducting islands 210 is specifically as follows: the first conducting layer 200 is hollowed out to form the plurality of opening regions, and the at least one conducting island 210 is disposed in each opening region.

Optionally, the gap between the periphery of each conducting island 210 and the edge of the corresponding opening region is greater than or equal to a preset value, and the preset value includes a sum of a process tolerance, an impurity maximum size and a reserved spacing.

In one specific implementation, one pad 520 corresponds to the plurality of conducting islands 210, the plurality of conducting islands 210 corresponding to the one pad 520 may be mutually independent, or mutually connected according to actual demands. For example, all the conducting islands 210 below a pad 520 are mutually connected, or part of the conducting islands 210 are mutually connected, or the two adjacent conducting islands 210 are mutually connected, or the two nonadjacent conducting islands 210 are mutually connected. For example, in the above technical solution, each opening region has the three conducting islands arranged in one row; and in the arrangement direction, a first conducting island 210 and a third conducting island 210 may be mutually connected.

Therefore, all the conducting islands 210 in any opening region may be mutually connected according to the demands.

In another specific implementation, all the conducting islands 210 in any opening region may be independent.

In one specific implementation, the first conducting layer 200 and the conducting islands 210 are formed at the same time in a preparation process through a single patterning process and are the same in material, and the material of the first conducting layer 200 and the conducting islands 210 includes copper or other conductive metals. For example, the material may be a laminated material of MoNb/Cu/MoNb formed in a sputtering mode, a bottom layer MoNb (300 Å) is used for improving the adhesive force, an intermediate layer Cu is used for transmitting electric signals, and a top layer MoNb (200 Å) is used for preventing oxidation. This film layer may further be formed in an electroplating mode, a seed layer MoNiTi is formed firstly to improve grain nucleation density, and then an anti-oxidation layer MoNiTi is manufactured after electroplating.

Figure 4:
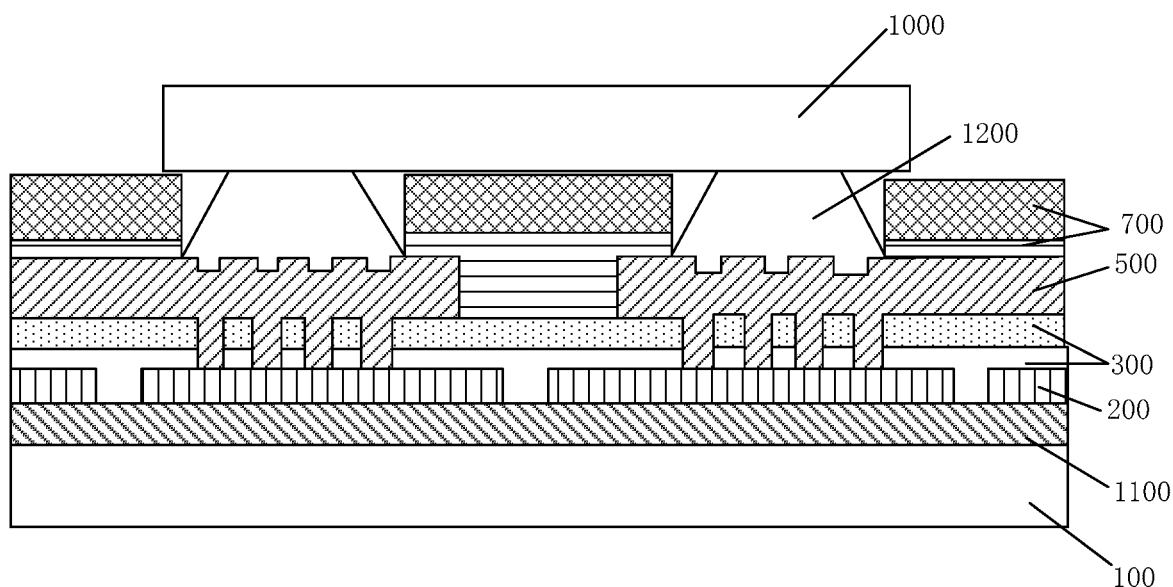
FIG. 4 is a schematic structural diagram after performing a surface-mount technology on the structure of FIG. 3.

As shown in FIGS. 4, 5 and 6, the driving backplane provided by the embodiment of the present disclosure further includes: the component 1000, and the component 1000 is connected with the pads 520 through a welding layer 1200 located in the second via holes 900. The second via holes 900 here are used for accommodating the welding layer 1200 when the component 1000 is welded. Specifically, the above component 1000 may be an LED lamp bead or a driving chip. In the embodiment of the present disclosure, different components 1000 are different in terminal quantity, and the quantity of the corresponding pads 520 is also different. For example, when the component 1000 is the LED lamp bead, one LED lamp bead corresponds to the two pads 520, where one pad 520 is a positive-electrode pad, and the other pad 520 is a negative-electrode pad. When the component 1000 is the driving chip, the quantity of pin terminals of the driving chip is large, and therefore, the pads 520 with the same quantity of the pin terminals are needed to be matched with the driving chip.

According to the driving backplane provided by the above implementation, when the component 1000 needs to be connected with the second via holes 900 in the second insulating layer 700 through SMT, a certain degree of heat gathering is generated at the component 1000. Because the second conducting layer 500 penetrates through the plurality of first via holes 310 to be connected with the first conducting layer 200 here, the second conducting layer 500 penetrated in the first via holes 310 may dissipate heat better.

In one embodiment, a buffer layer 1100 is disposed between the first conducting layer 200 and the base substrate 100.

In a second aspect, an embodiment of the present disclosure provides a display apparatus, including any one driving backplane of the first aspect.

In the display apparatus provided by the embodiment of the present disclosure, in a plurality of pads 520 in a second conducting layer 500 included in the driving backplane, a plurality of first via holes 310 are formed in a region, corresponding to each pad 520, of an insulating layer; and each pad 520 is electrically connected with a first conducting layer 200 through the plurality of first via holes 310. Due to existence of the plurality of first via holes 310, an embedded matching structure may be formed between the pads 520 of the second conducting layer 500 and the insulating layer firstly, and an adhesive force between the second conducting layer 500 and the insulating layer can be improved, so that the pads 520 of the second conducting layer 500 is not prone to falling off from the insulating layer. In addition, each pad 520 and the first conducting layer 200 are conducted through the plurality of first via holes 310, in this way, even if the first via holes 310 corresponding to a partial region in the pad 520 are damaged, the pad 520 may still keep good conducting with the first conducting layer 200 through the other first via holes 310, thereby increasing a yield for connection of the pads 520 in the second conducting layer 500 and the first conducting layer 200.

In a third aspect, an embodiment of the present disclosure provides a manufacturing method of a driving backplane, includes the following steps.

a first conducting layer 200 is formed on the base substrate 100; a second conducting layer 500 is formed on one side, facing away from the base substrate 100, of the first conducting layer 200; and a first insulating layer 300 is formed between the first conducting layer 200 and the second conducting layer 500; where the second conducting layer 500 includes a plurality of pads 520, and each pad 520 is connected with the first conducting layer 200 through a plurality of first via holes 310. In the manufacturing method of the driving backplane provided by the embodiment of the present disclosure, in the plurality of pads 520 in the above second conducting layer 500, the plurality of first via holes 310 are formed in a region, corresponding to each pad 520, of the insulating layer; and each pad 520 is electrically connected with the first conducting layer 200 through the plurality of first via holes 310. Due to the existence of the plurality of first via holes 310, an embedded matching structure may be formed between the pads 520 of the second conducting layer 500 and the insulating layer firstly, so that an adhesive force between the second conducting layer 500 and the insulating layer can be improved, and the pads 520 of the second conducting layer 500 are not prone to falling off from the insulating layer. In addition, each pad 520 and the first conducting layer 200 are conducted through the plurality of first via holes 310, in this way, even if the first via holes 310 corresponding to a partial region in the pad 520 are damaged, the pad 520 may still keep good conducting with the first conducting layer 200 through the other first via holes 310, thereby increasing a yield for connection of the pads 520 in the second conducting layer 500 and the first conducting layer 200.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A driving backplane, comprising:
a base substrate;
a first conducting layer disposed on one side of the base substrate;
a second conducting layer disposed on one side, facing away from the base substrate, of the first conducting layer; and
a first insulating layer disposed between the first conducting layer and the second conducting layer;
wherein the second conducting layer comprises a plurality of pads;
each of the plurality of pads is connected with the first conducting layer through at least two first via holes; and
each of the at least two first via holes penetrates through the first insulating layer and exposes part of the first conducting layer.

2. The driving backplane according to claim 1, wherein pore diameters of the at least two first via holes are 2 μm-40 μm.

3. The driving backplane according to claim 2, wherein each pad corresponds to the at least two first via holes; and
in a plurality of first via holes corresponding to a same pad, the pore diameters of at least two of the plurality of first via holes corresponding to the same pad are different.

4. The driving backplane according to claim 2, wherein each pad corresponds to the at least two first via holes; and the pore diameters of the at least two first via holes corresponding to the each pad are identical.

5. The driving backplane according to claim 1, wherein the first insulating layer between the first conducting layer and the second conducting layer comprises a plurality of sublayers; and
part of the sublayers are organic sublayers, and part of the sublayers are inorganic sublayers.

6. The driving backplane according to claim 5, the inorganic sublayers are respectively attached to the first conducting layer and the second conducting layer; and
at least one organic sublayer is disposed between the inorganic sublayers respectively attached to the first conducting layer and the second conducting layer.

7. The driving backplane according to claim 1, wherein a surface, facing away from the base substrate, of each pad has a concave-convex structure.

8. The driving backplane according to claim 1, wherein the first conducting layer has a plurality of opening regions and a plurality of conducting islands;
each of the plurality of opening regions is internally provided with at least one of the plurality of conducting islands;
a gap is formed between a periphery of each of the plurality of conducting islands and an edge of an corresponding opening region; and
each pad is electrically connected with the at least one conducting island.

9. The driving backplane according to claim 8, wherein the gap between the periphery of each conducting island and the edge of the corresponding opening region is greater than or equal to a preset value; and
the preset value comprises a sum of a process tolerance, an impurity maximum size and a reserved spacing.

10. The driving backplane according to claim 8, wherein one of the plurality of pads is connected with the plurality of conducting islands through the at least two first via holes;
wherein the plurality of conducting islands corresponding to the one pad are mutually independent; or,
at least one part of the plurality of conducting islands corresponding to the one pad are mutually connected.

11. The driving backplane according to claim 8, wherein a material of the conducting islands and a material of the first conducting layer are identical.

12. The driving backplane according to claim 11, wherein the materials of both the conducting islands and the first conducting layer are copper.

13. The driving backplane according to claim 8, further comprising: a second insulating layer disposed on one side, facing away from the base substrate, of the second conducting layer;
wherein the second insulating layer has second via holes, and the second via holes expose the plurality of pads.

14. The driving backplane according to claim 13, wherein in each pad and a second via hole corresponding to the each pad, an orthographic projection of the concave-convex structure on the surface, facing away from the base substrate, of the each pad on the base substrate is disposed in an orthographic projection of the second via hole on the base substrate.

15. The driving backplane according to claim 13, further comprising: a component;
wherein the component is connected with the plurality of pads through a welding layer disposed in the second via holes.

16. The driving backplane according to claim 15, the pads and pin terminals of the component connected with the pads are identical in quantity.

17. A display apparatus, comprising the driving backplane according to claim 1.

\* \* \* \* \*